(12) United States Patent
Kim et al.

(10) Patent No.: US 8,698,181 B2
(45) Date of Patent: Apr. 15, 2014

(54) LIGHT EMITTING DEVICE

(71) Applicant: LG Innotek Co., Ltd., Seoul (KR)

(72) Inventors: Kyung Jun Kim, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/863,940

(22) Filed: Apr. 16, 2013

(65) Prior Publication Data

US 2013/0228816 A1    Sep. 5, 2013

Related U.S. Application Data

(63) Continuation of application No. 13/049,683, filed on Mar. 16, 2011, now Pat. No. 8,455,914, which is a continuation of application No. 12/175,332, filed on Jul. 17, 2008, now Pat. No. 7,928,449.

(30) Foreign Application Priority Data

Jul. 23, 2007  (KR) .................. 10-2007-0073253

(51) Int. Cl.
*H01L 33/00*    (2010.01)
(52) U.S. Cl.
USPC .................. 257/98; 257/99; 257/E33.055
(58) Field of Classification Search
CPC ........ H01L 33/02; H01L 33/44; H01L 33/405
USPC ....................... 257/98, 99, E33.055
See application file for complete search history.

(56) References Cited

U.S. PATENT DOCUMENTS

| | | | |
|---|---|---|---|
| 5,814,839 | A | 9/1998 | Hosoba |
| 5,877,047 | A | 3/1999 | Weitzel et al. |
| 6,340,824 | B1 | 1/2002 | Komoto et al. |
| 7,049,635 | B2 | 5/2006 | Sano et al. |
| 2004/0089869 | A1 | 5/2004 | Uemura |
| 2004/0104395 | A1 | 6/2004 | Hagimoto et al. |
| 2006/0071230 | A1 | 4/2006 | Lee et al. |
| 2006/0163587 | A1 | 7/2006 | Erchak et al. |
| 2006/0234408 | A1 | 10/2006 | Lee et al. |
| 2007/0295952 | A1 | 12/2007 | Jang et al. |
| 2008/0006836 | A1 | 1/2008 | Lee |

FOREIGN PATENT DOCUMENTS

| | | | |
|---|---|---|---|
| JP | 2007-081313 A | | 3/2007 |
| KR | 10-2005-0104994 A | | 11/2005 |
| KR | 10-2006-0108882 A | | 10/2006 |

*Primary Examiner* — Nikolay Yushin
(74) *Attorney, Agent, or Firm* — Birch, Stewart, Kolasch & Birch, LLP (57) ABSTRACT

A light emitting device includes a second metal layer, a second semiconductor layer on the second metal layer, an active layer on the second semiconductor layer, a first semiconductor layer on the active layer, a first metal layer on the first semiconductor layer, an insulating layer between the second metal layer and the second semiconductor layer at a peripheral portion of an upper surface of the second metal layer, and a passivation layer surrounding lateral surfaces of the insulating layer, the second semiconductor layer, the active layer, and the first semiconductor layer, the passivation layer being on the second metal layer, wherein a lateral surface of the insulating layer is adjacent to a lateral surface of the second metal layer, and wherein a lowermost surface of the passivation layer is disposed lower than a lowermost surface of the insulating layer.

20 Claims, 9 Drawing Sheets

LIGHT EMITTING DEVICE

This application is a continuation of application Ser. No. 13/049,683, filed on Mar. 16, 2011, which is a continuation of application Ser. No. 12/175,332, filed on Jul. 17, 2008, now U.S. Pat. No. 7,928,449, and claims priority under 35 U.S.C. §119 of Korean Patent Application No. 10-2007-0073253, filed on Jul. 23, 2007. The entire contents of all of the above applications are hereby incorporated by reference.

BACKGROUND

The present disclosure relates to a light emitting device and a manufacturing method thereof.

A light emitting diode (LED) is widely used as a light emitting device.

The LED includes an N-type semiconductor layer, an active layer, and a P-type semiconductor layer stacked therein. Light is generated from the active layer and emitted to the outside when power is applied.

SUMMARY

Embodiments provide a light emitting device and a manufacturing method thereof.

Embodiments also provide a light emitting device with an improved electrical insulation characteristic, and a manufacturing method thereof.

In an embodiment, a light emitting device comprises: a second metal layer; a second conduction type semiconductor layer on the second metal layer; an active layer on the second conduction type semiconductor layer; a first conduction type semiconductor layer on the active layer; a first metal layer on the first conduction type semiconductor layer; an insulating layer being disposed on a peripheral portion of an upper surface of the second metal layer and being disposed under a lower surface of the second conduction type semiconductor layer; and a passivation layer on lateral surfaces of the insulating layer, the second conduction type semiconductor layer, the active layer and the first conduction type semiconductor layer, the passivation layer being on an upper surface of the second metal layer, wherein the insulating layer is disposed between the second metal layer and the second conduction type semiconductor layer at the peripheral portion of the upper surface of the second metal layer, wherein the upper surface of the second metal layer contacts to the lower surface of the second conduction type semiconductor layer at a central portion of the upper surface of the second metal layer, and wherein a lateral surface of the insulating layer is adjacent to a lateral surface of the second metal layer.

In an embodiment, a light emitting device comprises: a second metal layer including a plurality of layers; a second conduction type semiconductor layer on the second metal layer; an active layer on the second conduction type semiconductor layer; a first conduction type semiconductor layer on the active layer; a first metal layer on the first conduction type semiconductor layer; an insulating layer being disposed on a peripheral portion of an upper surface of the second metal layer, and being disposed under a lower surface of the second conduction type semiconductor layer, and a passivation layer on lateral surfaces of the insulating layer, the second conduction type semiconductor layer, the active layer and the first conductive type semiconductor layer, the passivation layer being on an upper surface of the second metal layer, wherein the insulating layer is disposed between the second metal layer and the second conduction type semiconductor layer at the peripheral portion of the upper surface of the second metal layer, wherein a lateral surface of the insulating layer is adjacent to a lateral surface of the second metal layer, and wherein an upper surface of the first conduction type semiconductor layer comprises an uneven surface.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device and a manufacturing method thereof according to embodiments are described in detail with reference to the accompanying drawings.

In the following description, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, and one or more intervening layers may also be present. In addition, it will also be understood that when a layer is referred to as being 'between' two layers, it can be the only layer between the two layers, or one or more intervening layers may also be present. Also, 'on' and 'under' of each layer is judged using the drawings as a reference.

Hereinafter, a light emitting device and a manufacturing method thereof according to embodiments are described in detail with reference to the accompanying drawings.

Embodiment 1

Figure 1:
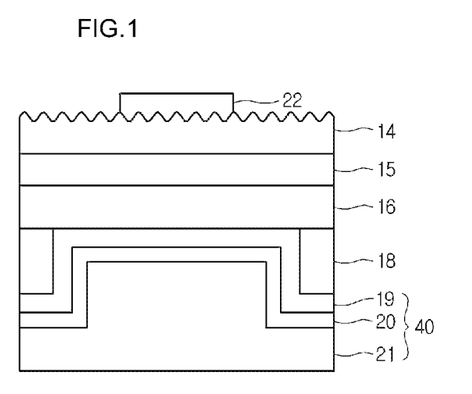
FIG. 1 is a cross-sectional view explaining a light emitting device according to a first embodiment.

FIG. 1 is a cross-sectional view explaining a light emitting device according to a first embodiment.

Referring to FIG. 1, a light emitting device includes: a second electrode layer 40; a second conduction type semiconductor layer 16 on the second electrode layer 40; an active layer 15 on the second conduction type semiconductor layer 16; a first conduction type semiconductor layer 14 on the active layer 15; and a first electrode layer 22 on the first conduction type semiconductor layer 14.

Also, the second electrode layer 40 may include a metal layer 21, a reflective layer 20 formed on the metal layer 21, and an ohmic contact layer 19 formed on the reflective layer 20.

The metal layer 21 can be formed of at least one of Ti, Cr, Ni, Al, Pt, Au, W, and a conductive substrate. The reflective layer 20 can be formed of metal including at lease one of Ag, Al, Cu, and Ni having high light reflectivity. The ohmic contact layer 19 can be a transparent electrode layer, and for example, can be formed of at least one of indium tin oxide (ITO), ZnO, $RuO_x$, $TiO_x$, and $IrO_x$.

Also, an insulating layer 18 is formed between the second electrode layer 40 and the second conduction type semiconductor layer 16 along the lateral surface of the light emitting device. The insulating layer 18 contacts the upper surface and the lateral surface of the second electrode layer 40, and contacts the lower surface of the second conduction type semiconductor layer 16. The insulating layer 18 can be a nitride layer in the group III having a thickness of 0.5-10 μm. For example, the insulating layer 18 can be an $Al_xGa_{1-x}N$ layer (0<x≤1).

The central portion of the metal layer 21 protrudes to the direction in which the second conduction type semiconductor layer 16 is disposed. The central portions of the reflective layer 20 and the ohmic contact layer 19 also protrude to the direction in which the second conduction type semiconductor layer 16 is disposed.

Therefore, portions of the metal layer 21 and the reflective layer 20 are disposed on the same horizontal plane, and portions of the metal layer 21 and the ohmic contact layer 19 are disposed on the same horizontal plane.

Also, portions of the metal layer 21 and the insulating layer 18 can be disposed on the same horizontal plane. Portions of the metal layer 21, the reflective layer 20, the ohmic contact layer 19, and the insulating layer 18 can be disposed on the same horizontal plane.

The upper surface of the first conduction type semiconductor layer 14 is not formed to have a uniform height but has an uneven surface including convex portions and concave portions.

In the light emitting device according to the first embodiment, the insulating layer 18 is formed between the second conduction type semiconductor layer 16 and the second electrode layer 40, so that the first conduction type semiconductor layer 14 or the first electrode layer 22 is spaced further from the second electrode layer 40.

Therefore, short-circuit between the first conduction type semiconductor layer 14 or the first electrode layer 22 and the second electrode layer 40 by an external foreign substance can be prevented.

That is, since the second conduction type semiconductor layer 16 is formed to have a very thin thickness, short-circuit between the first conduction type semiconductor layer 14 and the second electrode layer 40, or between the first electrode layer 22 and the second electrode layer 40 may occur. The light emitting device according to the first embodiment can prevent the short-circuit through the insulating layer 18.

Particularly, in the light emitting device according to the first embodiment, the insulating layer 18 can be a nitride layer and the nitride layer can be formed with a thick thickness, so that short-circuit is effectively prevented.

FIGS. 2 to 6 are views explaining a method for manufacturing a light emitting device according to the first embodiment.

Figure 2:
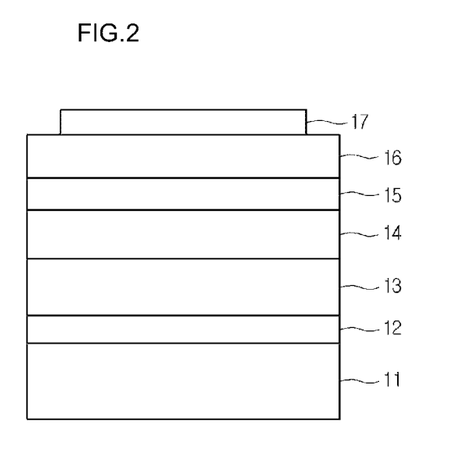
FIGS. 2 to 6 are views explaining a method for manufacturing a light emitting device according to a first embodiment.

Referring to FIG. 2, a substrate 11, a buffer layer 12, an un-doped GaN layer 13, a first conduction type semiconductor layer 14, an active layer 15, and a second conduction type semiconductor layer 16 are sequentially formed.

Also, a mask layer 17 is formed on positions spaced from peripheral portions on the second conduction type semiconductor layer 16. For example, the mask layer 17 can be formed of $SiO_2$ or SiN.

Figure 3:
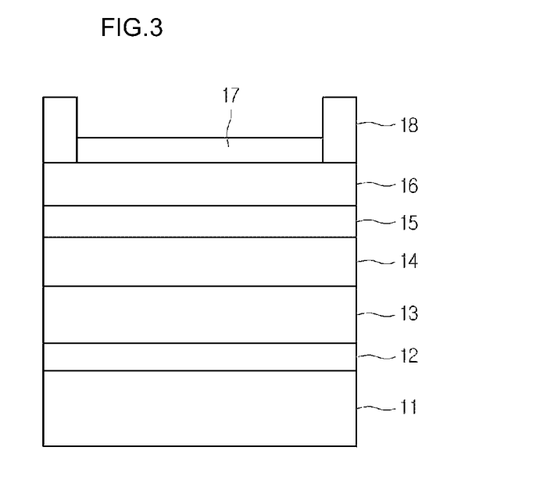

Referring to FIG. 3, an insulating layer 18 is deposited on the second conduction type semiconductor layer 16 on which the mask layer 17 is formed.

The insulating layer 18 can be a nitride layer in the group III. For example, the insulating layer 18 can be an $Al_xGa_{1-x}N$ layer (0<x≤1).

At this point, the insulating layer 18 does not grow at the central portion where the mask layer 17 is formed, but grows on only the peripheral portions of the second conduction type semiconductor layer 16 where the mask layer 17 is not formed.

The insulating layer 18 can be grown by flowing tri methyl gallium (TMGa) gas and trimethyl aluminum (TMAl) gas together with a hydrogen gas and an ammonia gas into a chamber at temperature of 600-1200° C.

The insulating layer 18 has an insulation characteristic with a carrier concentration of $6 \times 10^{15}$-$3 \times 10^{17}$/cm$^3$. At this point, the resistance of the insulating layer 18 is greater than that of heat-treated second conduction type semiconductor layer 16.

Since the insulating layer 18 is formed using a nitride layer in the light emitting device according to the first embodiment, the insulating layer 18 having a thickness of 0.5-10 μm can be formed. Also, since the insulating layer 18 is formed using the nitride layer, it can be formed by a general MOCVD equipment.

Figure 4:
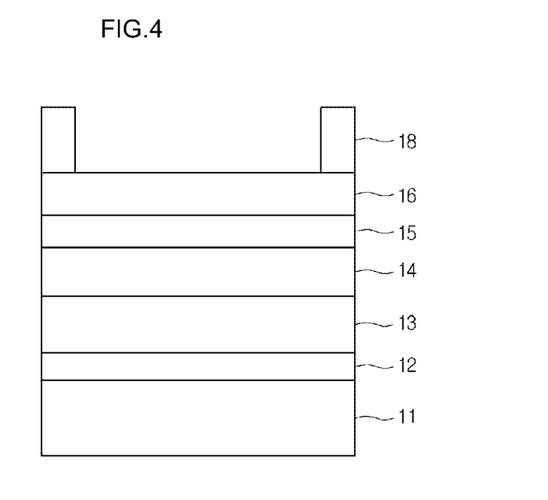

Referring to FIG. 4, the mask layer 17 is removed. Therefore, only the insulating layer 18 remains on the second conduction type semiconductor layer 16.

Figure 7:
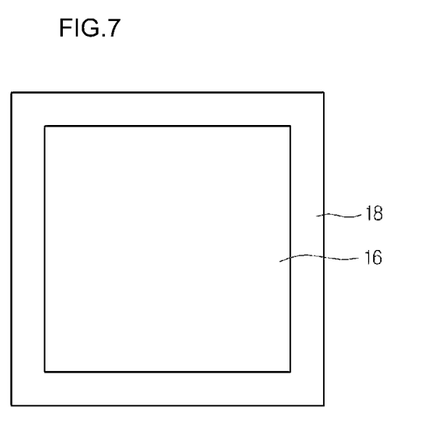
FIG. 7 is a view of a second conduction type semiconductor layer where an insulating layer is formed as viewed from the upper side in a light emitting device according to a first embodiment.

FIG. 7 is a view of a second conduction type semiconductor layer where an insulating layer is formed as viewed from the upper side.

Referring to FIG. 7, the insulating layer 18 is formed along the peripheral portion of the second conduction type semiconductor layer 16, and the second conduction type semiconductor layer 16 is exposed through the central portion.

Figure 5:
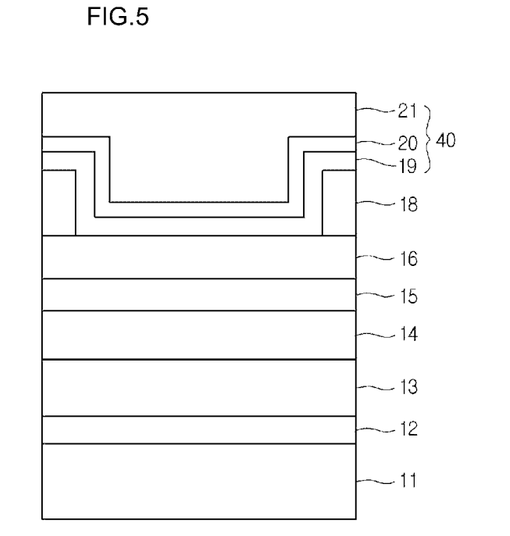

Referring to FIG. 5, a second electrode layer 40 is formed on the insulating layer 18 and the second conduction type semiconductor layer 16.

The second electrode layer 40 can be formed by sequentially depositing an ohmic contact layer 19, a reflective layer 20, and a metal layer 21.

Figure 6:
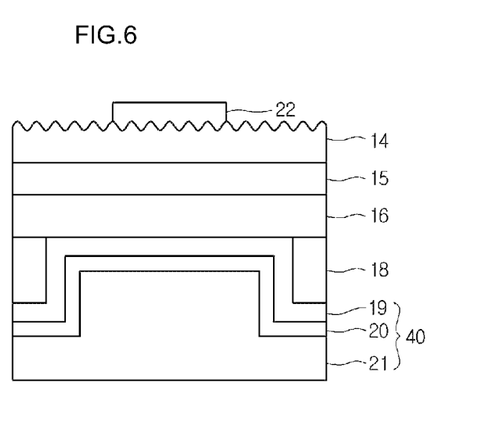

Referring to FIG. 6, the substrate 11, the buffer layer 12, and the un-doped GaN layer 13 are removed. The substrate 11, the buffer layer 12, and the un-doped GaN layer 13 can be removed by a laser or an etching process.

As the substrate 11, the buffer layer 12, and the un-doped GaN layer 13 are removed, the first conduction type semiconductor layer 14 is exposed, and the upper surface of the first conduction type semiconductor layer 14 is selectively etched such that it has an uneven surface.

Processing the upper surface of the first conduction type semiconductor layer 14 such that it has an uneven surface is intended for allowing light from the active layer 15 to be efficiently emitted.

Also, a first electrode layer 22 is formed on the first conduction type semiconductor layer 14.

Though not shown in detail, the first electrode layer 22 can include an ohmic contact layer.

As described above, the light emitting device according to the first embodiment provides the insulating layer 18 between the second electrode layer 40 and the second conduction type semiconductor layer 16 along the outer lateral surface of the light emitting device, thereby improving the electrical characteristic of the light emitting device.

Embodiment 2

Figure 8:
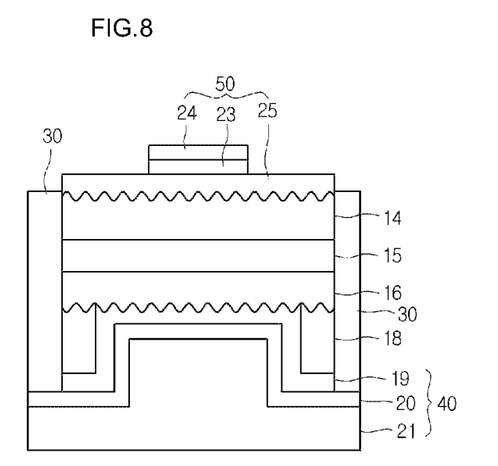
FIG. 8 is a cross-sectional view explaining a light emitting device according to a second embodiment.

FIG. 8 is a cross-sectional view explaining a light emitting device according to a second embodiment.

Referring to FIG. 8, a light emitting device includes: a second electrode layer 40; a second conduction type semiconductor layer 16 on the second electrode layer 40; an active layer 15 on the second conduction type semiconductor layer 16; a first conduction type semiconductor layer 14 on the active layer 15; and a first electrode layer 50 on the first conduction type semiconductor layer 14.

Also, the second electrode layer 40 can include a metal layer 21, and a reflective layer 20 and an ohmic contact layer 19 formed on the metal layer 21.

The metal layer 21 can be formed of at least one of Ti, Cr, Ni, Al, Pt, Au, W, and a conductive substrate. The reflective layer 20 can be formed of metal including at lease one of Ag, Al, Cu, and Ni having high light reflectivity. The ohmic contact layer 19 can be a transparent electrode layer, and for example, can be formed of at least one of indium tin oxide (ITO), ZnO, $RuO_x$, $TiO_x$, and $IrO_x$.

The first electrode layer 50 can include an ohmic contact layer 25, a seed layer 23 formed on the ohmic contact layer 25, and a metal layer 24 formed on the seed layer 23.

The ohmic contact layer 25 can be a transparent electrode layer, and for example, can be formed of at least one of indium tin oxide (ITO), ZnO, $RuO_x$, $TiO_x$, and $IrO_x$.

Also, the insulating layer 18 is formed between the second electrode layer 40 and the second conduction type semiconductor layer 16 along the lateral surface of the light emitting device. The insulating layer 18 can be a nitride layer in the group III having a thickness of 0.5-10 μm. For example, the insulating layer 18 can be an $Al_xGa_{1-x}N$ layer (0<x≤1).

The central portion of the metal layer 21 protrudes to the direction in which the second conduction type semiconductor layer 16 is disposed. The central portions of the reflective layer 20 and the ohmic contact layer 19 also protrude to the direction in which the second conduction type semiconductor layer 16 is disposed.

The upper surface of the first conduction type semiconductor layer 14, and the lower surface of the second conduction type semiconductor layer 16 are not formed to have a uniform height. They have an uneven surface including convex portions and concave portions.

Also, a passivation layer 30 is formed on the lateral surfaces of the light emitting device.

The passivation layer 30 can be formed of at least one of $SiO_2$, SiN, $Al_2O_3$, $SU_8$, SiON, SiCN, and a nitride in the group III.

Therefore, portions of the metal layer 21 and the reflective layer 20 are disposed on the same horizontal plane. Portions of the metal layer 21 and the ohmic contact layer 19 are disposed on the same horizontal plane. Also, portions of the metal layer 21 and the passivation layer 30 are disposed on the same horizontal plane.

Also, portions of the metal layer 21, the insulating layer 18, and the passivation layer 30 can be disposed on the same horizontal plane. Portions of the metal layer 21, the reflective layer 20, the ohmic contact layer 19, the insulating layer 18, and the passivation layer 30 can be disposed on the same horizontal plane.

In the light emitting device according to the second embodiment, the insulating layer 18 is formed between the second conduction type semiconductor layer 16 and the second electrode layer 40, so that the first conduction type semiconductor layer 14 or the first electrode layer 50 is spaced further from the second electrode layer 40.

Therefore, short-circuit between the first conduction type semiconductor layer 14 or the first electrode layer 50 and the second electrode layer 40 by an external foreign substance can be prevented.

That is, since the second conduction type semiconductor layer 16 is formed to have a very thin thickness, short-circuit between the first conduction type semiconductor layer 14 and the second electrode layer 40, or between the first electrode layer 50 and the second electrode layer 40 may occur. The light emitting device according to the embodiment can prevent the short-circuit through the insulating layer 18.

Particularly, in the light emitting device according to the embodiment, the insulating layer 18 can be a nitride layer and the nitride layer can be formed with a thick thickness, so that short-circuit is effectively prevented.

Also, the passivation layer 30 is formed on the outer surfaces of the light emitting device according to the second embodiment, so that short-circuit between the first conduction type semiconductor layer 14 and the second electrode layer 40, or between the first electrode layer 50 and the second electrode layer 40 by an external foreign substance can be prevented.

FIGS. 9 to 19 are views explaining a method for manufacturing a light emitting device according to the second embodiment.

In description of the method for manufacturing the light emitting device according to the embodiment, manufacturing two light emitting devices on one substrate is exemplarily shown for easy understanding of a process of forming the passivation layer 30.

Figure 9:
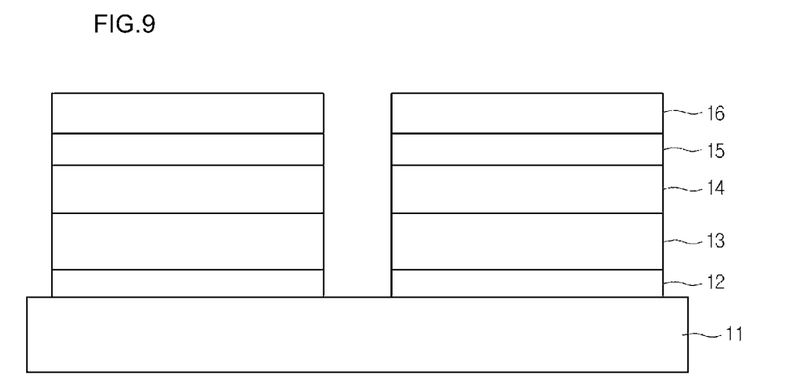
FIGS. 9 to 19 are views explaining a method for manufacturing a light emitting device according to a second embodiment.

Referring to FIG. 9, a substrate 11, a buffer layer 12, an un-doped GaN layer 13, a first conduction type semiconductor layer 14, an active layer 15, and a second conduction type semiconductor layer 16 are sequentially formed.

Figure 10:
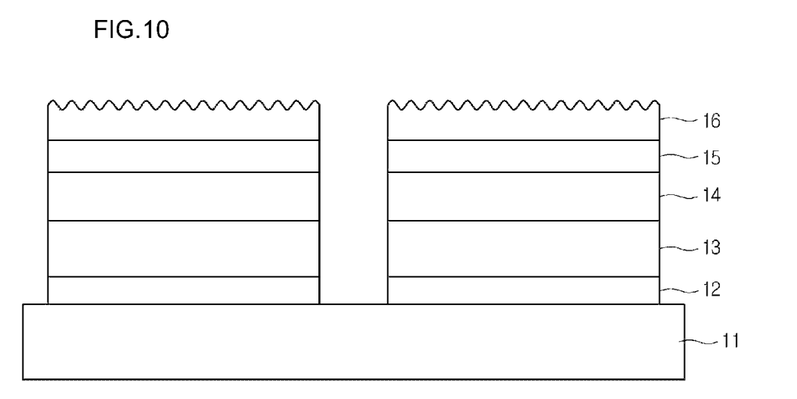

Referring to FIG. 10, the upper surface of the second conduction type semiconductor layer 16 is selectively etched to form an uneven surface including convex portions and concave portions. At this point, a drying or wet etching process can be used as the etching process.

Figure 11:
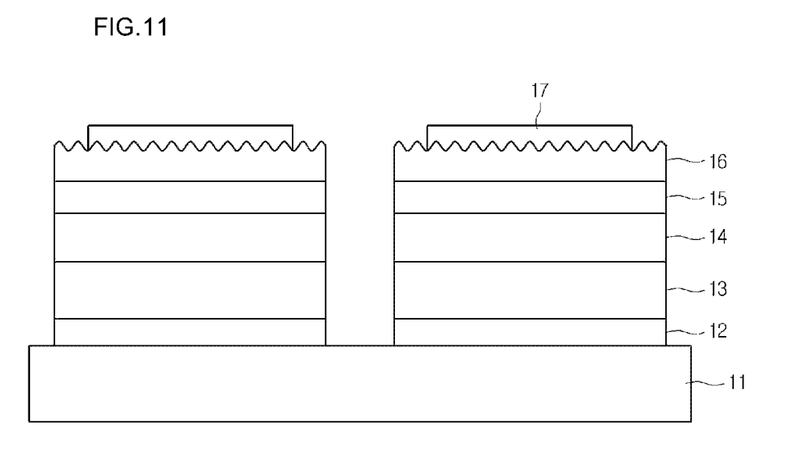

Referring to FIG. 11, a mask layer 17 is formed on positions spaced from peripheral portions on the second conduction type semiconductor layer 16. The mask layer 17 can be formed of $SiO_2$ or SiN.

Figure 12:
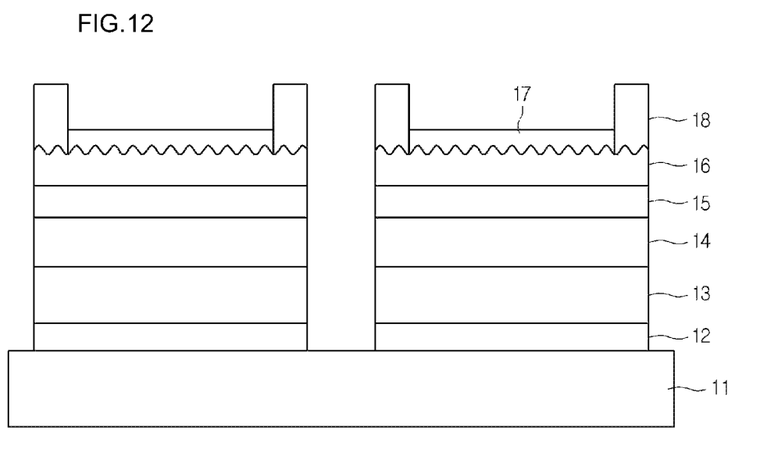

Referring to FIG. 12, an insulating layer 18 is deposited on the second conduction type semiconductor layer 16 on which the mask layer 17 is formed.

The insulating layer 18 can be a nitride layer in the group III. For example, the insulating layer 18 can be an $Al_xGa_{1-x}N$ layer (0<x≤1).

At this point, the insulating layer 18 does not grow at the central portion where the mask layer 17 is formed, but grows on only the peripheral portions of the second conduction type semiconductor layer 16 where the mask layer 17 is not formed.

The insulating layer 18 can be grown by flowing tri methyl gallium (TMGa) gas and trimethyl aluminum (TMAl) gas together with a hydrogen gas and an ammonia gas into a chamber at temperature of 600-1200° C.

The insulating layer 18 has an insulation characteristic with a carrier concentration of $6 \times 10^{15}$-$3 \times 10^{17}$/cm$^3$. At this point, the resistance of the insulating layer 18 is greater than that of heat-treated second conduction type semiconductor layer 16.

Since the insulating layer 18 is formed using a nitride layer in the light emitting device according to the second embodiment, the insulating layer 18 having a thickness of 0.5-10 μm can be formed.

Also, since the insulating layer 18 is formed using the nitride layer, it can be formed by a general MOCVD equipment.

Figure 13:
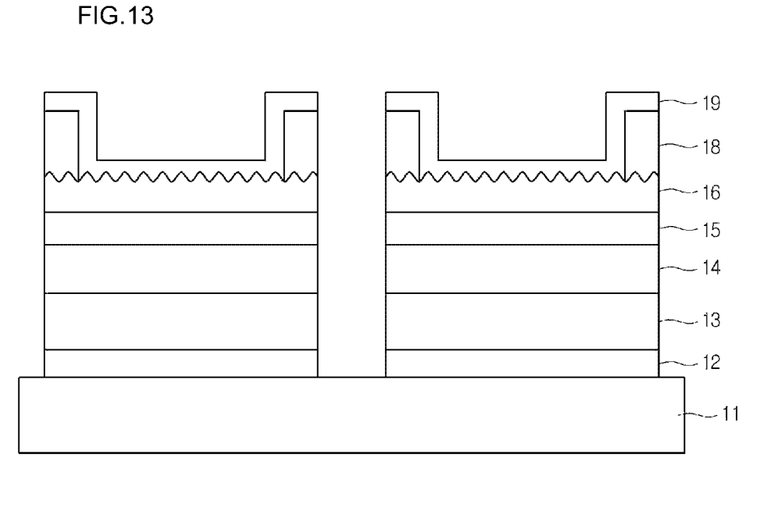

Referring to FIG. 13, the mask layer 17 is removed. Therefore, only the insulating layer 18 remains on the second conduction type semiconductor layer 16.

Also, an ohmic contact layer 19 is formed on the second conduction type semiconductor layer 16 and the insulating layer 18.

Figure 14:
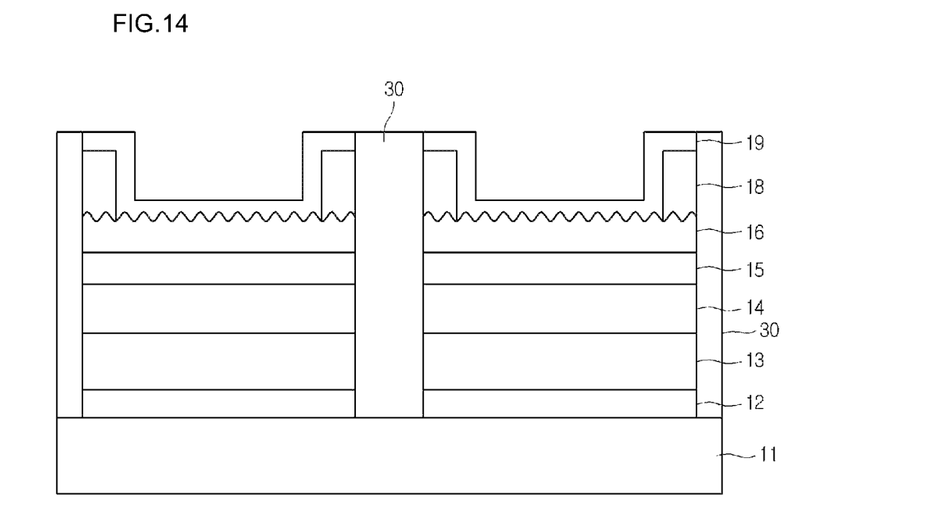

Referring to FIG. 14, a passivation layer 30 is formed on the lateral surfaces of the light emitting device.

Figure 15:
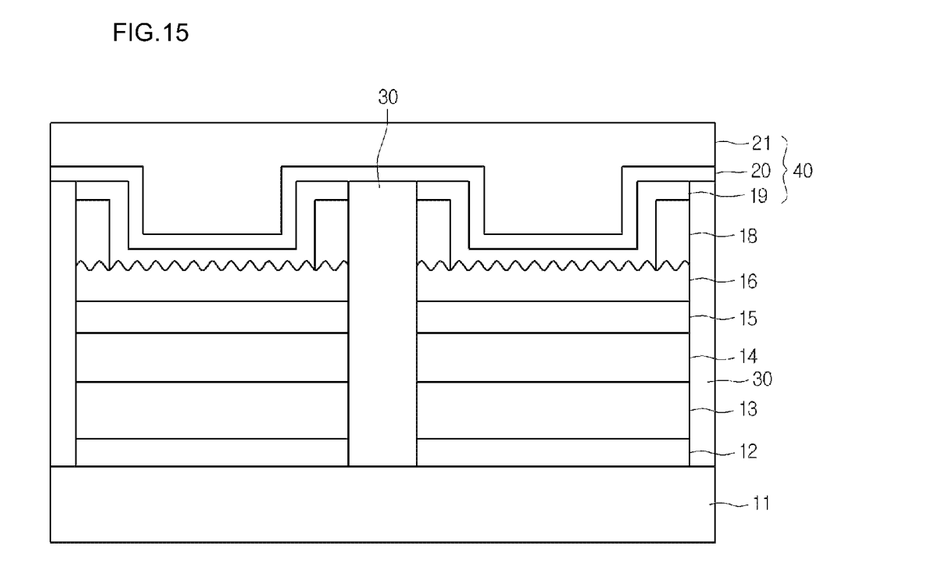

Referring to FIG. 15, a reflective layer 20 and a metal layer 21 are formed on the passivation layer 30 and the ohmic contact layer 19, so that a second electrode layer 40 is formed.

Figure 16:
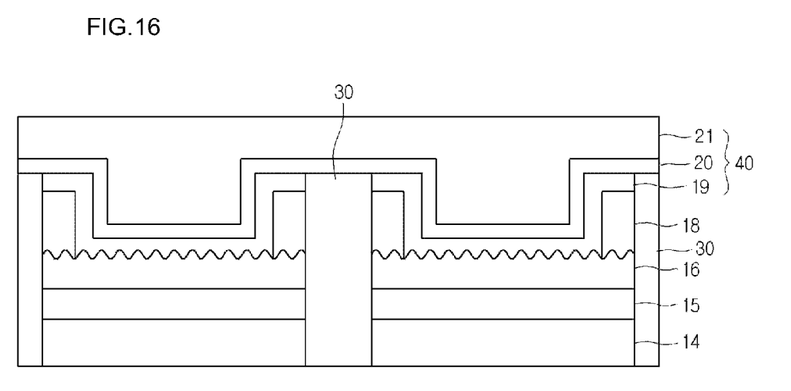

Referring to FIG. 16, the substrate 11, the buffer layer 12, and the un-doped GaN layer 13 are removed.

The substrate 11, the buffer layer 12, and the un-doped GaN layer 13 can be removed by a laser or an etching process.

As the substrate 11, the buffer layer 12, and the un-doped GaN layer 13 are removed, the first conduction type semiconductor layer 14 and the passivation layer 30 are exposed.

Figure 17:
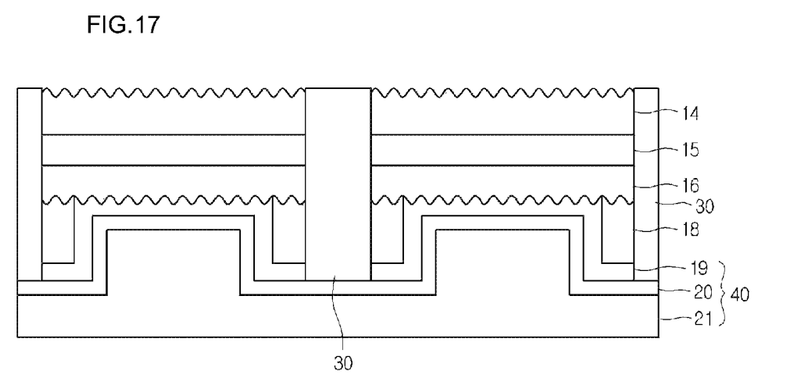

Referring to FIG. 17, the upper surface of the first conduction type semiconductor layer 14 is selectively etched such that it has an uneven surface.

Processing the upper surface of the first conduction type semiconductor layer 14 such that it has an uneven surface is intended for allowing light from the active layer 15 to be efficiently emitted.

Figure 18:
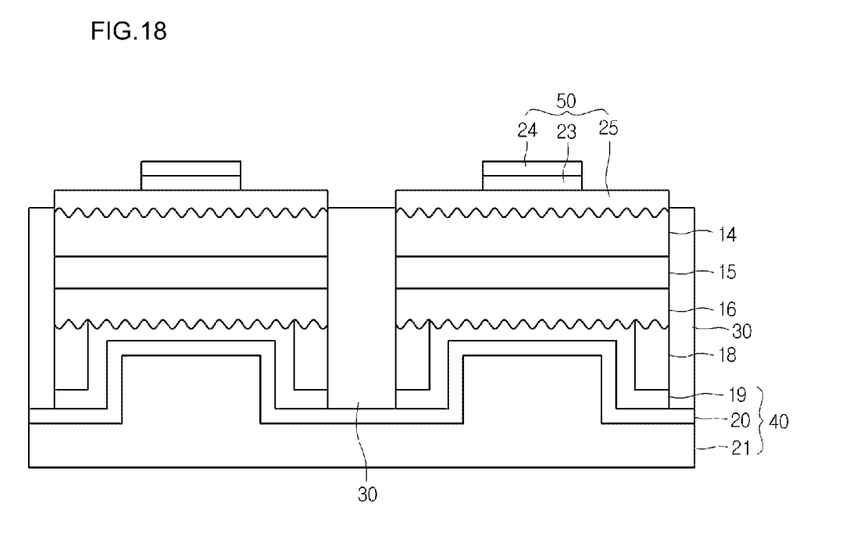

Referring to FIG. 18, a first electrode layer 50 is formed on the first conduction type semiconductor layer 14.

The first electrode layer 50 can include an ohmic contact layer 25, a seed layer 23, and a metal layer 24.

Figure 19:
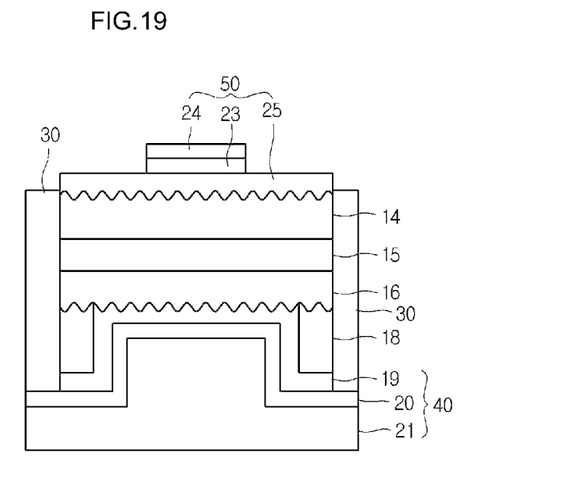

Referring to FIG. 19, the two light emitting devices shown in FIG. 18 are separated into individual light emitting devices. FIG. 19 illustrates one light emitting device separated.

As described above, the light emitting device according to the embodiment provides the insulating layer 18 between the second electrode layer 40 and the second conduction type semiconductor layer 16 along the outer lateral surface of the light emitting device, thereby improving the electrical characteristic of the light emitting device.

Also, the light emitting device according to the embodiment provides the passivation layer 30 on the lateral sides of the light emitting device, thereby improving the electrical insulation characteristic of the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a second metal layer;
a second semiconductor layer on the second metal layer;
an active layer on the second semiconductor layer;
a first semiconductor layer on the active layer;
a first metal layer on the first semiconductor layer;
an insulating layer between the second metal layer and the second semiconductor layer at a peripheral portion of an upper surface of the second metal layer; and
a passivation layer surrounding lateral surfaces of the insulating layer, the second semiconductor layer, the active layer, and the first semiconductor layer, the passivation layer being on the second metal layer,
wherein the upper surface of the second metal layer contacts to a lower surface of the second semiconductor layer at a central portion of the upper surface of the second metal layer,
wherein a lateral surface of the insulating layer is adjacent to a lateral surface of the second metal layer, and
wherein a lowermost surface of the passivation layer is disposed lower than a lowermost surface of the insulating layer.

2. The light emitting device according to claim 1, wherein the insulating layer and the passivation layer are formed of nitride layer.

3. The light emitting device according to claim 1, wherein the insulating layer and the passivation layer are formed of a different material.

4. The light emitting device according to claim 1, wherein a lower surface of the second metal layer has a flat shape, and the central portion of the upper surface of the second metal layer has a shape protruding to a direction in which the second semiconductor layer is disposed.

5. The light emitting device according to claim 1, wherein the passivation layer is formed of at least one selected from the group consisting of $SiO_2$, SiN, $Al_2O_3$, $SU_8$, SiON, SiCN, and a nitride in the group III.

6. The light emitting device according to claim 1, wherein at least one lateral surface of the second metal layer and at least one lateral surface of the passivation layer are disposed on the same plane.

7. The light emitting device according to claim 1, wherein the second metal layer comprises an ohmic contact layer and a reflective layer.

8. The light emitting device according to claim 1, wherein the second metal layer comprises at least one of Ti, Cr, Ni, Al, Pt, Au, W, Ag, Cu, ITO, ZnO, RuOx, TiOx, or IrOx.

9. A light emitting device comprising:
a second metal layer including a plurality of layers;
a second semiconductor layer on the second metal layer;
an active layer on the second semiconductor layer;
a first semiconductor layer on the active layer;
a first metal layer on the first semiconductor layer;
an insulating layer between the second metal layer and the second semiconductor layer at a peripheral portion of an upper surface of the second metal layer; and
a passivation layer surrounding lateral surfaces of the insulating layer, the second semiconductor layer, the active layer and the first semiconductor layer, the passivation layer being on the second metal layer,
wherein a lateral surface of the insulating layer is adjacent to a lateral surface of the second metal layer, wherein an upper surface of the first semiconductor layer comprises an uneven surface, and wherein a lowermost surface of the passivation layer is disposed lower than a lowermost surface of the insulating layer.

10. The light emitting device according to claim 9, wherein a portion of the passivation layer contacts an upper portion of the first semiconductor layer.

11. The light emitting device according to claim 9, wherein the second metal layer comprises an ohmic contact layer and a reflective layer.

12. The light emitting device according to claim 9, wherein the upper surface of the second metal layer contacts to the lower surface of the second semiconductor layer at a central portion of the upper surface of the second metal layer.

13. The light emitting device according to claim 9, a lower surface of the first metal layer comprises an uneven surface corresponding to a portion of the uneven surface of the first semiconductor layer.

14. The light emitting device according to claim 9, wherein the insulating layer and the passivation layer are formed of nitride layer.

15. The light emitting device according to claim 9, wherein the insulating layer and the passivation layer are formed of a different material.

16. The light emitting device according to claim 9, wherein a lower surface of the second metal layer has a flat shape, and a central portion of the upper surface of the second metal layer has a shape protruding to a direction in which the second semiconductor layer is disposed.

17. The light emitting device according to claim 9, wherein the passivation layer is formed of at least one selected from the group consisting of $SiO_2$, SiN, $Al_2O_3$, $SU_8$, SiON, SiCN, and a nitride in the group III.

18. The light emitting device according to claim 9, wherein at least one lateral surface of the second metal layer and at least one lateral surface of the passivation layer are disposed on the same plane.

19. The light emitting device according to claim 9, wherein the second metal layer comprises at least one of Ti, Cr, Ni, Al, Pt, Au, W, Ag, Cu, ITO, ZnO, RuOx, TiOx, or IrOx.

20. The light emitting device according to claim 9, wherein the insulating layer comprises a nitride layer in the group III.

* * * * *